(12) United States Patent
Pezeshki

(10) Patent No.: US 8,902,944 B2
(45) Date of Patent: Dec. 2, 2014

(54) HIGH POWER MULTI-WAVELENGTH LASER SOURCE

(75) Inventor: Bardia Pezeshki, Menlo Park, CA (US)

(73) Assignee: Kaiam Corp., Newark, CA (US)

(*) Notice: Subject to any disclaimer, the term of this patent is extended or adjusted under 35 U.S.C. 154(b) by 487 days.

(21) Appl. No.: 12/901,441

(22) Filed: Oct. 8, 2010

(65) Prior Publication Data

US 2011/0158272 A1 Jun. 30, 2011

Related U.S. Application Data

(60) Provisional application No. 61/249,869, filed on Oct. 8, 2009.

(51) Int. Cl.
*H01S 3/00* (2006.01)
*H01S 5/14* (2006.01)
*H01S 5/022* (2006.01)
*H01S 5/026* (2006.01)
*H01S 5/40* (2006.01)

(52) U.S. Cl.
CPC .............. *H01S 5/4087* (2013.01); *H01S 5/141* (2013.01); *H01S 5/02248* (2013.01); *H01S 5/0268* (2013.01); *H01S 5/4031* (2013.01); *H01S 5/4062* (2013.01); *H01S 5/4012* (2013.01)
USPC ....................................................... 372/38.02

(58) Field of Classification Search
USPC .................................. 372/38.02; 385/14, 37
See application file for complete search history.

(56) References Cited

U.S. PATENT DOCUMENTS

| 5,396,507 | A * | 3/1995 | Kaminow et al. ............... 372/20 |
| 6,192,170 | B1 * | 2/2001 | Komatsu ......................... 385/15 |
| 6,320,888 | B1 | 11/2001 | Tanaka et al. |
| 6,445,858 | B1 | 9/2002 | Musk |
| 7,099,360 | B2 | 8/2006 | Bhowmilk et al. |
| 7,616,877 | B2 * | 11/2009 | Zarnowski et al. ............. 396/85 |
| 8,346,037 | B2 | 1/2013 | Pezeshki et al. |
| 2003/0223672 | A1 | 12/2003 | Joyner et al. |
| 2005/0018951 | A1 | 1/2005 | Mossberg et al. |
| 2006/0198415 | A1 | 9/2006 | Yamazaki |
| 2009/0213882 | A1 * | 8/2009 | Weida et al. .................... 372/23 |
| 2009/0269069 | A1 * | 10/2009 | Mahgerefteh et al. .......... 398/82 |

OTHER PUBLICATIONS

Soole et al. "Wavelength-selectable laser emission from a multistripe array grating integrated cavity laser" Applied Physics Letters, vol. 61, No. 23, Dec. 1992 (pp. 2750-2752).
Daneu et al. "Spectral beam combining of a broadstripe diode laser array in an external cavity" Conference on Lasers and Electro-Optics, 2000 (CLEO 2000). May 7-12, 2000. San Francisco, CA.
U.S. Appl. No. 13/691,546, filed Nov. 30, 2012, Pezeshki et al.
U.S. Appl. No. 13/691,535, filed Nov. 30, 2012, Pezeshki et al.

* cited by examiner

*Primary Examiner* — Tuan Nguyen
(74) *Attorney, Agent, or Firm* — Klein, O'Neill & Singh, LLP

(57) ABSTRACT

An optical assembly comprises a combination of semiconductor optical gain elements, microlenses, and a wavelength-selective planar lightwave circuit (PLC) that routes light of different wavelengths from a different inputs to a single output. The microlenses couple light from the semiconductor optical gain elements into the PLC. The positions of the microlenses can be adjusted using micromechanical holders that are part of their carriers, and are free to move initially, and fixed in place after optimization of the optical coupling. In operation, the gain elements are activated simultaneously, with one wavelength of light lasing within each gain element. All output wavelengths of light exit from a single output of the PLC in a single spatial mode.

10 Claims, 10 Drawing Sheets

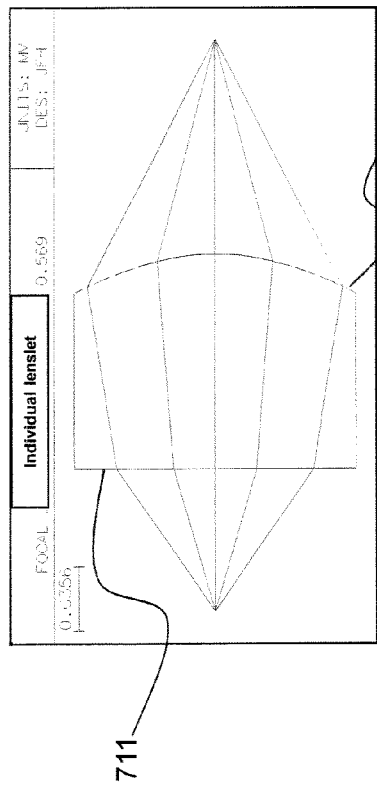
FIG. 7a
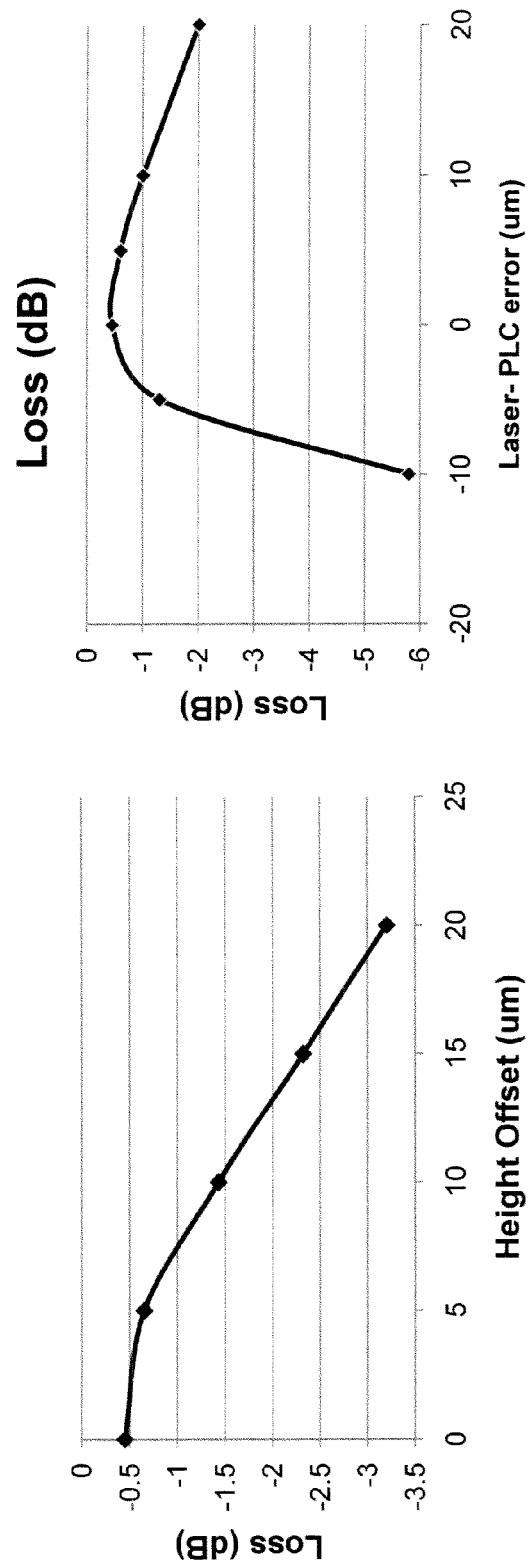
FIG. 7b
FIG. 7c

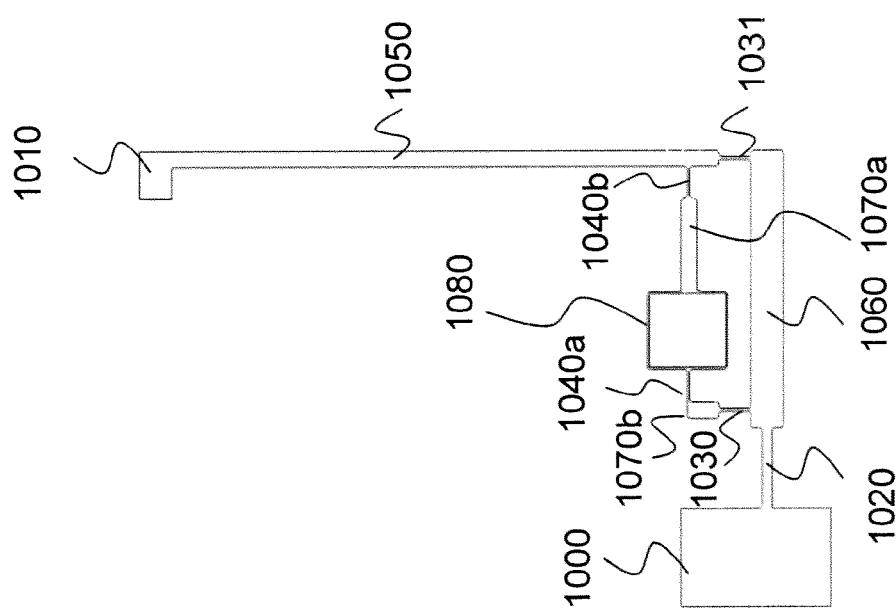

HIGH POWER MULTI-WAVELENGTH LASER SOURCE

CROSS REFERENCE TO RELATED APPLICATIONS

This application claims the benefit of the filing date of U.S. Provisional Application No. 61/249,869, filed Oct. 8, 2009, entitled "High Power Multi-Wavelength Laser Source," the disclosure of which is incorporated by reference.

BACKGROUND OF THE INVENTION

This invention relates generally to semiconductor light sources, and more particularly to high output power multiple wavelength devices.

Semiconductor laser sources have proven useful in many applications, ranging from optical storage (DVD/Blue-Ray), to fiber-optic telecommunications, to optical pumps for solid state lasers. Their advantages are their small size, relatively high output power and brightness, and ability to control the wavelength. However, the total output power one can obtain from a single laser element in a single spatial mode has been limited to about 1 to a few Watts, depending on the wavelength and material. To obtain higher output power, certain sacrifices generally must be made.

The simplest way to get more power out of a semiconductor laser source is to make the optical waveguide wider. In these "broad area" structures, the output power is much higher, but the light is coming from a larger source and multiple lateral modes are excited. Therefore it is generally not possible to focus the light into a small spot, or collimate the beam with precision. To get even higher power, arrays of broad area lasers are fowled into bars and can generate hundreds of watts of power—limited only by the ability to extract the heat. The light however is coming from a very large area and the device acts much more like a light bulb than a laser, with no spatial coherence. Nevertheless, such "bars" can be used to pump solid state crystals like Nd/YAG to get secondary lasing in the crystals. This secondary lasing can be single mode with high brightness. Alternatively, such bars can be coupled to multimode fibers that can pump a double-clad fiber laser, once again leading to secondary lasing in a single spatial mode. These fiber lasers have recently been very successful displacing high power YAG or CO2 lasers for material and processing applications. The issue with using semiconductor optical pumps for fiber lasers or solid state lasers is that the lasing wavelength is now fixed by the crystal and not by the diode. Efficiency is also sacrificed, and the structure becomes large and cumbersome.

It is possible to attempt to increase the single spatial mode output power of semiconductor lasers, for example by phase-locking a number of individual emitters together (phased-arrays), or by using a semiconductor amplifier structure (MOPA—master oscillator and power amplifier). However, the arrays tend to lock out of phase, causing a dead spot in the center of the beam. In MOPA structures, the high optical density tends to distort the phase of the light and the spatial coherence. Furthermore, high power MOPA structures require flared amplifier sections that lead to a mode with very high astigmatism and asymmetry, further reducing their utility.

One can obtain higher output powers by combining the optical output of different lasers together, when each laser is designed to emit at different wavelength. In this way multiple laser outputs are combined with a wavelength selective element such as a diffraction grating or an arrayed waveguide grating (AWG). Light of different polarizations can also be combined in a loss-less fashion with a polarizing beam splitter, which increases the number of possible inputs by a factor of 2. For example for Raman pumping optical amplifiers, multiple 1450-1500 nm wavelengths are frequently combined into a single output. The problem with this approach is that each laser must be designed to a precise wavelength, and carefully coupled to multiplexer. The coupling loss between laser to fiber, and fiber to multiplexer and the loss of the multiplexer itself all reduce the total output power. With multiple optical couplings and precise wavelength lasers, the overall system becomes complex and expensive.

An alternate way of making a multi-wavelength system is to use multiple gain chips with a single wavelength selective element. The feedback to each gain chip occurs at a different wavelength and the outputs are automatically combined into one. There have been demonstrations of this approach using integrated InP technology. The problem is that the optical loss of the InP multiplexer is high. In such an external cavity configuration, the impact of this loss on laser power is higher than a loss that comes outside of the cavity. Furthermore, an integrated chip is large and has poor yield.

BRIEF SUMMARY OF THE INVENTION

Some aspects of the invention provides a multiple wavelength external cavity laser, where a low-loss PLC is used as the wavelength-selective element and multiple semiconductor gain chips are used. The optical alignment of the cavity, or the coupling between the gain chips and the PLC, is obtained by moveable lenses whose positions can be adjusted, and then fixed in optimal position. The lenses are attached to micromechanical features that can be moved either with external actuators, or with actuators built into the package. The wavelength of each gain element is set by the PLC and in operation multiple gain elements are activated simultaneously. The output will be a comb of wavelengths all exiting from the same spatial mode from the PLC.

Some aspects of the invention provides a high power multi-wavelength light source, comprising: a plurality of laser diode gain elements, each antireflection coated at its output, each gain element having sufficient gain to allow for lasing at at least any of a plurality of wavelengths; a planar lightwave circuit (PLC) including wavelength selective elements, the planar lightwave circuit configured to route light from a plurality of antireflection coated inputs to a single output and to reflect at least some of the light from the single output to the plurality of inputs on a wavelength selective basis, such that light of different wavelengths are routed to different inputs of the plurality of inputs; and a plurality of lenses, each configured to couple light between one of the laser diode gain elements and a corresponding input of the plurality of inputs of the PLC.

In some aspects the invention provides a high power multi-wavelength light source, comprising: a plurality of laser diode gain elements; an optical structure arranged to combine light from the laser diode gain elements and to selectively feedback light to the laser diode gain elements on a wavelength selective basis; a plurality of lenses, each of the lenses arranged to couple light between a one of the laser diode gain elements and the optical structure, each of the plurality of lenses being mounted on a structure including at least a lever.

In some aspects the invention provides method of fabricating a high power multi-wavelength light source, comprising: etching a substrate to form a plurality of lens mounting structures; applying metallization to the etched substrate: and soldering a plurality of gain diodes, lenses, and a planar lightwave circuit (PLC) to the substrate, with the gain diodes, lenses, and PLC positioned so as to be in optical communication.

These and other aspects of the invention are more fully comprehended upon review of this disclosure.

BRIEF DESCRIPTION OF THE DRAWINGS

FIG. 7a shows a schematic of a planar-convex silicon lens suitable for coupling light between laser gain elements and a PLC, while FIGS. 7b and 7c show the loss of the coupling as a function of initial error in placement of the components, with it being assumed that the lens is moved to compensate for an initial error—Since the compensation from the lens adjustment is not perfect, there is a residual loss that varies as a function of the initial error.

FIGS. 8c,d showing the top device layer etched to form a spring, lens holder and cantilever, and FIGS. 8e,f showing oxide under those parts etched away along with some underlying silicon to allow for movement.

FIG. 10 illustrated a further MEMS structure useful for a coupling scheme.

DETAILED DESCRIPTION

Figure 1:
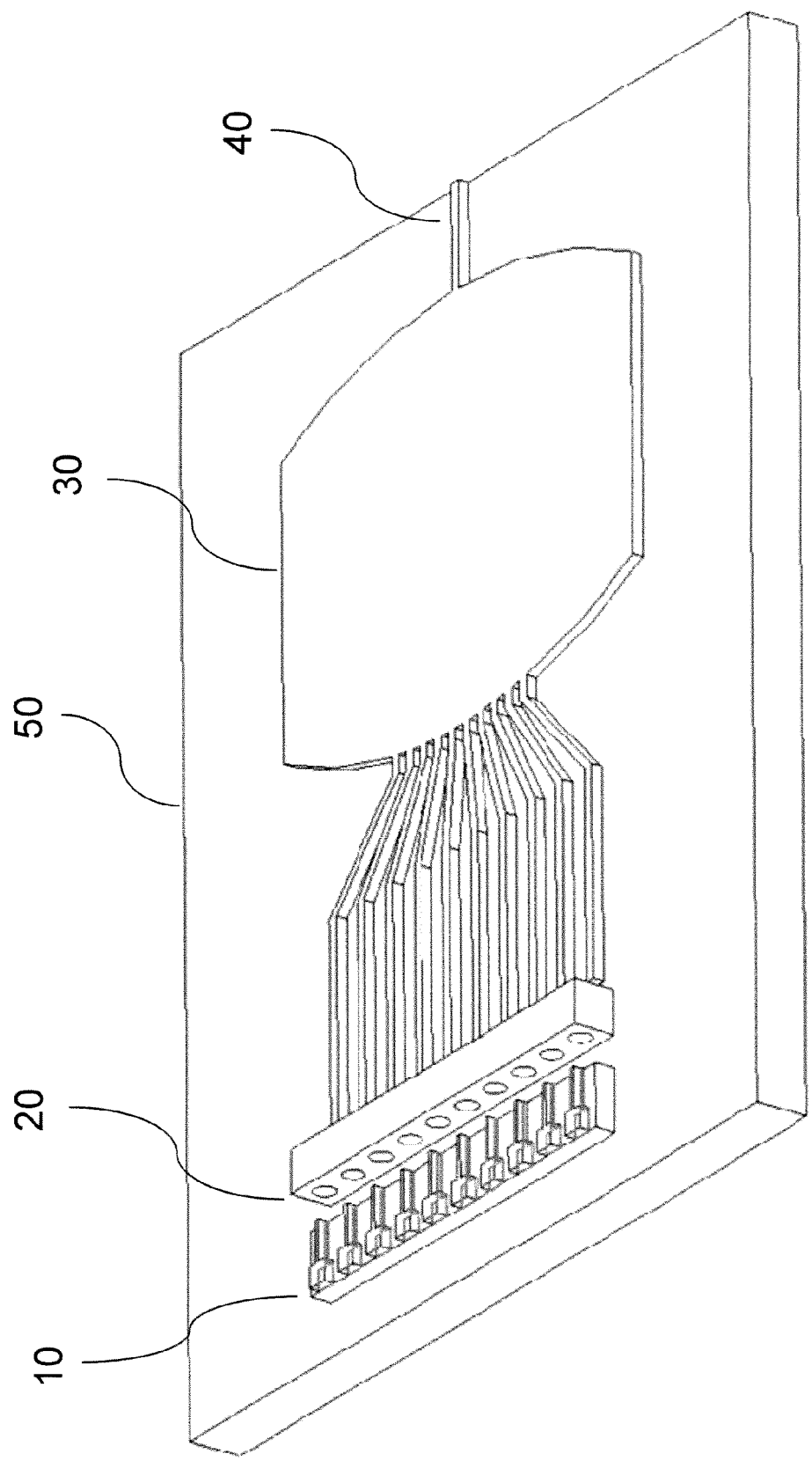
FIG. 1 shows a multiwavelength source where an array of gain elements is coupled to a multiplexer using MEMS-based adjustable lenses in accordance with aspects of the invention.

Structurally, an embodiment in accordance with aspects of the invention is shown schematically in FIG. 1. Light is generated in several semiconductor laser diode gain elements 10. The laser diode gain elements, do not include gratings or front facet feedback to generate lasing by themselves, instead make use of an external cavity for feedback to lase. The laser diode gain elements have sufficient gain bandwidth to lase at a number of different wavelengths, and the exact lasing wavelength is determined by which wavelength is reflected back into the cavity. The laser diode gain elements can be an array of devices fabricated on the same substrate, as shown in FIG. 1, or individual elements spaced a small distance apart. The embodiment of FIG. 1 includes a set of lenses 20, one for each semiconductor gain element. Similar to the gain elements, these lenses can be a microlens array, built on a common substrate, or composed of individual lenses discretely mounted. The position of these lenses is initially adjustable, but is locked down after alignment. The lenses couple light from the gain elements to a planar lightwave circuit (PLC) 30. The PLC is wavelength selective and routes a different wavelength from each of its inputs to a one output 40. The assembly is planar in nature, with the gain elements, lenses, and PLC substantially on the same plane, and mounted on a common substrate 50.

Figure 2A:
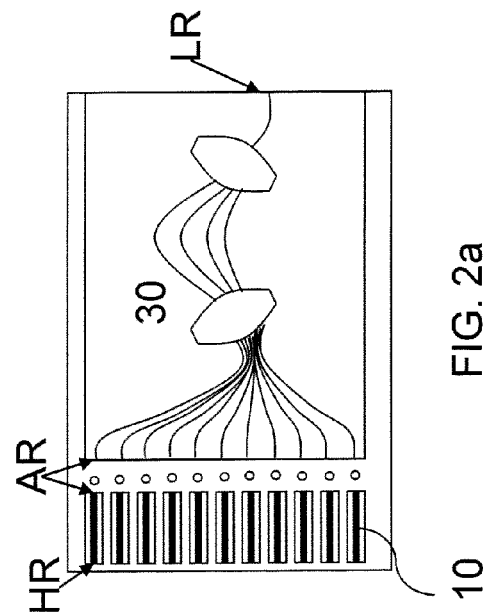
FIGS. 2a and 2b show an embodiment in accordance with aspects of this invention in more detail, with FIG. 2a showing gain elements that are antireflection coated such that lasing can only occur through the PLC, and FIG. 2b showing a block diagram indicating that the PLC is serving two functions: one is providing feedback at a particular wavelength to each gain chip, and second to combine all the outputs together.

FIG. 2a shows a further embodiment in accordance with aspects of the invention. As in the embodiment of FIG. 1, outputs of gain elements 10 are coupled by lenses 20 to a PLC 30. As shown in FIG. 2a, the back facet of each gain chip is coated with high reflectivity (HR) layers to minimize power loss from the back. The front of each gain element is anti reflection (AR) coated to prevent spurious reflections and maximize the power that is transmitted into the PLC. Similarly, the front facet of the PLC is anti-reflection coated, and either component may even be angled in some embodiments in order to minimize reflections. All the gain elements receive feedback from the one output facet of the PLC which is coated with a low reflectivity (LR) coating, typically 2% to 10%. In the embodiment of FIG. 2a the wavelength-selective filter in the PLC is shown as an arrayed waveguide grating (AWG). In various embodiments other structures that can feedback different wavelengths and combine them may be utilized, such as an Echelle grating or Mach-Zehnder structures.

Figure 2B:
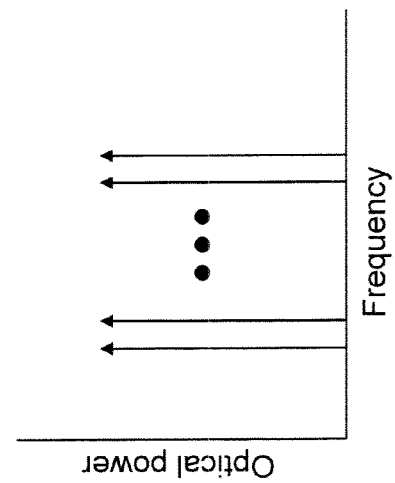
Figure 2B:
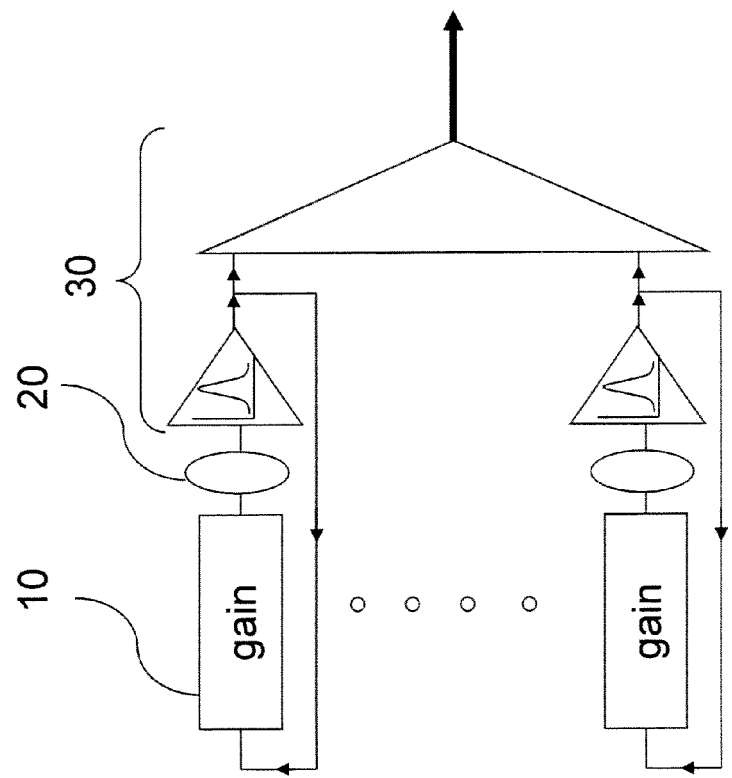

FIG. 2b is a block diagram of aspects of an embodiment of FIG. 2a. Functionally, the PLC 30 acts in two ways, as shown in FIG. 2b. The PLC selects a wavelength to feedback to each gain element, and also multiplexes all the powers together. At the output of the PLC each gain chip is lasing at a different wavelength and all the power is combined.

Figure 3B:
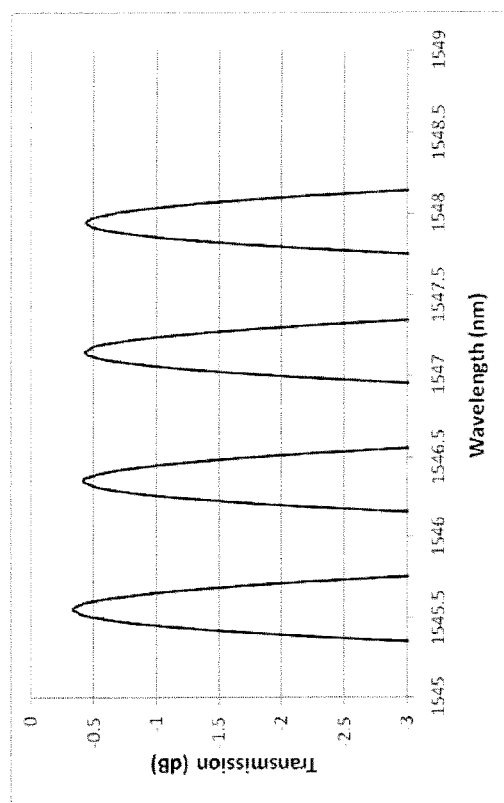
FIGS. 3a and 3b shows characteristics of a silica PLC that can be used for this application.
Figure 3A:
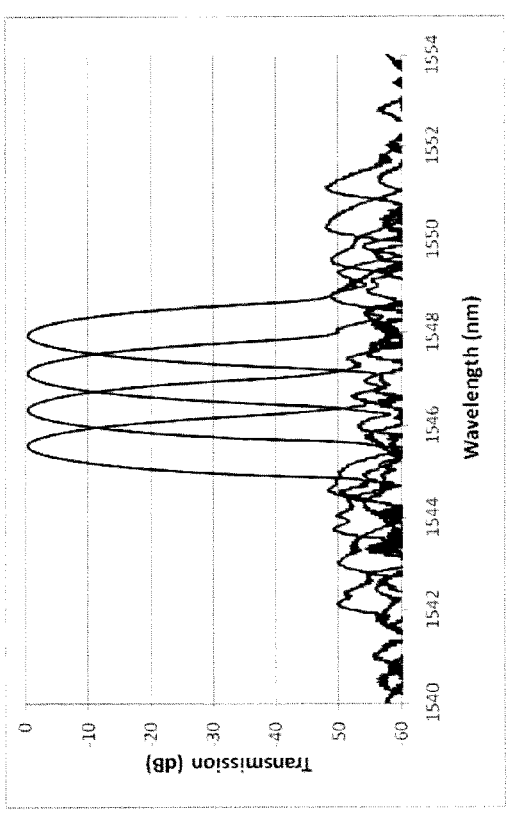

For high output power, minimal loss in the coupling and the PLC is preferred. Today, Gaussian passband PLCs are generally available from various manufacturers with very low internal loss. FIG. 3 shows the transmission characteristics of 4 channels out of a 40 wavelength AWG with 100 GHz spacing. As may be seen, the internal loss of the PLC is less than 0.5 dB. The device will automatically lase at the wavelength of minimum loss, so no flat-top or complex pass-band characteristics are needed in many embodiments.

Figure 4:
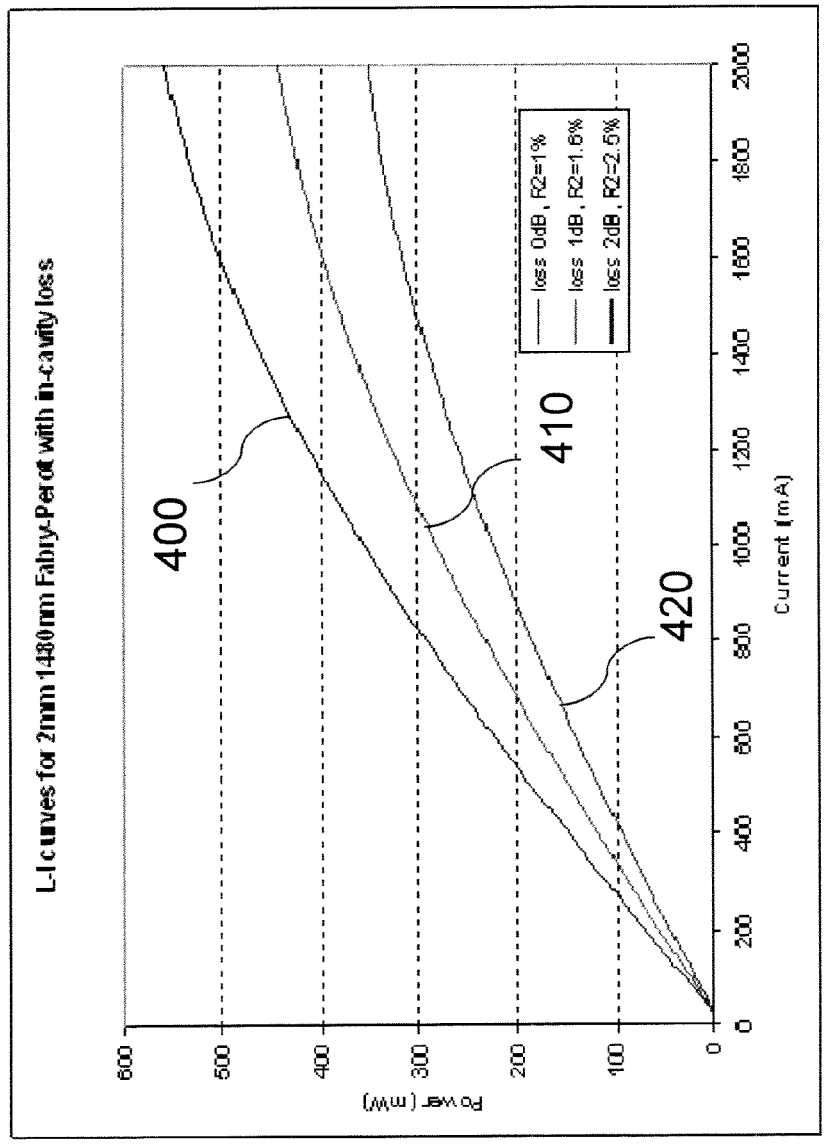
FIG. 4 shows a calculation of power emitted from a single gain chip through the combiner as a function of the intra-cavity loss of the combiner.

The total loss of this multiwavelength external cavity source also includes the coupling loss between the gain element and the PLC. For one particular implementation this coupling loss is estimated to be another 0.5 dB, for example as discussed later. Thus the total loss is the sum of 0.5 dB PLC loss and 0.5 dB coupling loss, or roughly 1 dB. FIG. 4 shows a simulation of output power from one single gain element when an intra-cavity loss is added. A top curve 400 is with no additional loss, and about 550 mW exits the front facet at 2 A of current. When 1 dB of intra-cavity loss is included, the power drops to about 430 mW for 2 A of current as shown in a curve 410, and at 2 dB of intra-cavity loss, which would be expected to be the worst case, the power drops to 350 mW for 2 A of current as shown by a curve 420. Though the power drops per channel, many more channels may be added. For example, with 40 channels and a 1 dB loss, there would be a total power output of more than 17 W.

Figure 5:
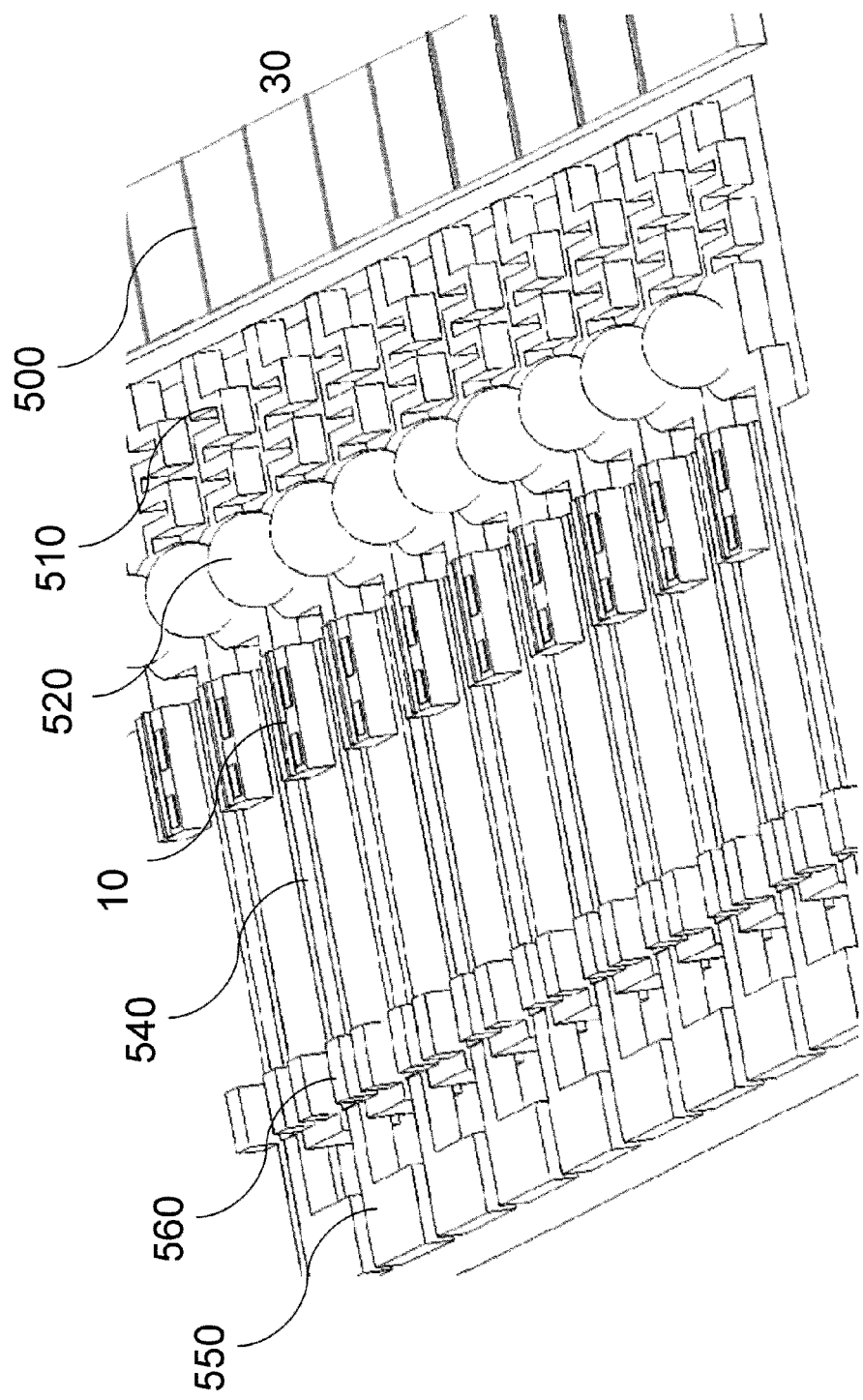
FIG. 5 shows detail of a MEMS structure useful for a coupling scheme, with the lenses on integrated holders that can be moved to adjust the coupling and then locked into place.

Obtaining simple and low loss optical alignment between the PLC and the gain chips is preferred. A method and structure of optical coupling between lasers and PLCs is discussed in U.S. Provisional Patent Application No. 61/148,551, filed Jan. 30, 2009, and U.S. patent application Ser. No. 12/698,086, filed Feb. 1, 2010, both of which are incorporated herein in their entirety. The same or a similar technique may be used for optical coupling of embodiments discussed herein. FIG. 5 shows a schematic of structure useful for optical coupling. The PLC 30 has multiple input waveguides, such as input waveguide 500. A lens, such as 520 focuses the light from the gain chip 10 into this input waveguide. The figure shows a ball lens in this application, but in various embodiments other types of focusing lens are used. The lens is mounted on a movable stage and can be repositioned during an alignment process to optimize the coupling. In this case the lens in positioned on one end of a silicon spring 510 that can be flexed up and down or left and right, or compressed and stretched. The lens is moved by translating a handle 550 at the end of cantilever 540 that is connected to the lens and the spring. Since the lens is partway up the cantilever, there is a physical deleveraging that occurs. A large shift of the handle causes a much smaller shift of the lens. Once the position of the lens is optimized, the handle is locked down by melting predeposited solder on the wafer 560. Thus the cantilever and holder transform submicron alignment tolerances of the lens to many microns.

Figure 6:
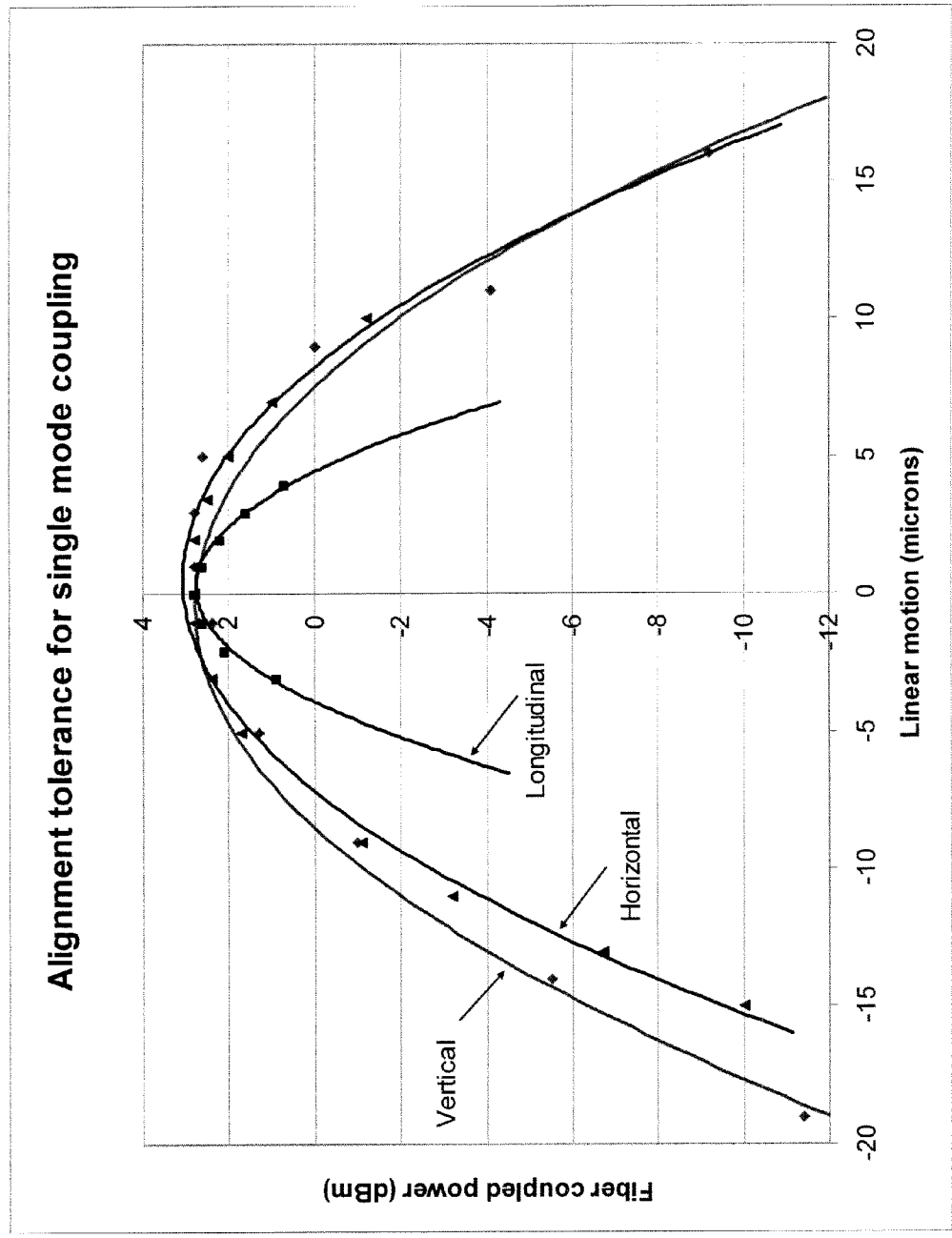
FIG. 6 shows experimental results of how the coupling to the PLC is varied as the ends of a cantilever holding the lens are moved in three axes, indicating that the cantilever physically increases the tolerances for alignment.

FIG. 6 shows some experimental results of alignment tolerance for single mode coupling. In this case the coupled power between a laser and a PLC is measured as the handle is moved in different directions. Typically horizontal and vertical alignment tolerances of single mode systems are on the other of 1 um or less. The longitudinal alignment is much looser, on the order of a few microns, depending on the lens' depth of focus. As shown in FIG. 6, one can see that the 3 dB alignment tolerance has been expended to approximately +/−10 microns—a ten fold relaxation. The longitudinal alignment tolerance stays the same at about 4 microns. In the figure the points represent measured data while the solid lines are best quadratic fits to the data.

Though FIG. 5 shows a ball lens, in various embodiments other kinds of lens can be used. Probably best is a planoconvex silicon lens that has a high index of refraction. Such lenses can be fabricated using wafer-scale processes by a number of commercial vendors. FIG. 7a shows a cross section of such a lens optimized for this application. One side 711 of the lens is flat since it was the bottom of the silicon wafer used to fabricate the lens, while an opposing side 713 is curved and has been shaped using a lithographic process. This type of lens works particular well when it focuses a high NA small mode of a semiconductor laser into a lower NA larger mode of a silica PLC. As previously described, the position of this lens is adjusted to optimize the coupling once the gain chip and the PLC have both been bonded securely in place. FIGS. 7b and 7c show the coupling loss between the gain chip and the PLC as a function of the error in original positions. For example, if the PLC and the gain chip are of different heights, the initial coupling will be poor. The lens is then adjusted to reoptimize the coupling, but not all the power can be recovered due to off-axis limits of the lens. This remaining loss is shown in FIG. 7b. For example, an error of 10 microns would lead to about 1.5 dB of unrecoverable loss. Under optimal conditions, the loss is less than 0.5 dB. Given the roughly circular beam sizes, the vertical and lateral tolerances are expected to be about the same. In FIG. 7c, the longitudinal penalty is shown. If the gain chip and PLC are bonded too close or too far away from each other, then once again the lens can be moved to re-optimize the coupling, but there will still be a penalty as the mode matching will not be perfect. In this case if the spacing is too far by 10 microns, the total coupling loss would go from 0.5 dB to 1 dB. If the spacing is too short, the penalty is worse, with the 1 dB point occurring at 5 microns.

Figure 8B:
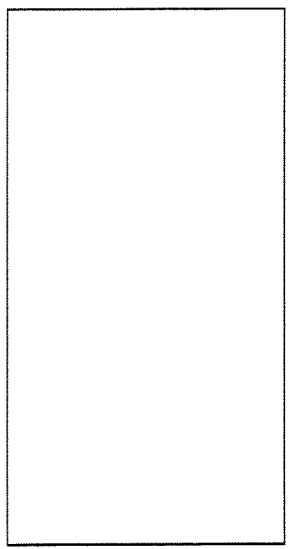
FIGS. 8a-f show a typical fabrication procedure for an assembly in accordance with aspects of the invention, with FIGS. 8a,c,e showing cross-sectional views and FIGS. 8b,d,f, showing respective corresponding top views; with FIGS. 8a,b showing a silicon-on-insulator wafer.
Figure 8D:
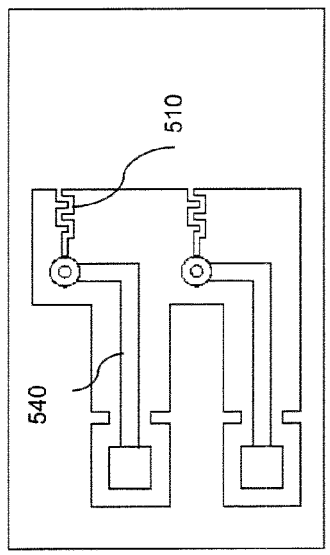
Figure 8F:
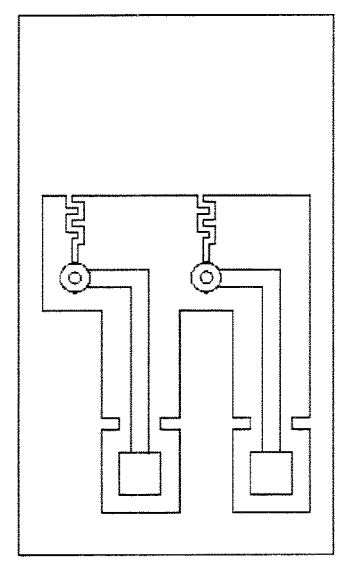
Figure 8A:
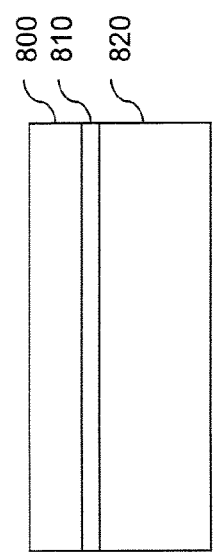

A fabrication technique for an embodiment in accordance with aspects of the invention is straightforward and follows the guideline described above and is shown schematically in FIGS. 8a-f and 9a-d. An embodiment is described in detail, but of course there can be numerous variations. As shown in FIGS. 8a,b, a substrate 820 is silicon-on-insulator, ideally bonded and etched back with an n-doped device layer 800 that is 15 um thick on an oxide 810 that is 5 microns thick. The substrate 820 thickness is generally not important, but is typically 500 um thick and ideally p-doped.

Figure 8C:
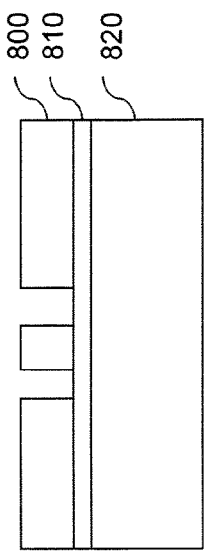
Figure 8E:
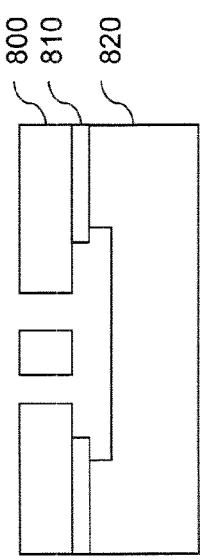

The substrate is then etched to form springs 510, cantilevers 540 and other features, with the etch stopping on the oxide, as shown in FIGS. 8c,d. An RIE process that can lead to controllable side walls is preferred. The features on the front are the parts that will move in order to align and lock the lens. Though at this point nothing can move as there is oxide under the elements. This oxide is removed as shown in FIGS. 8e,f using hydrofluoric acid. A vapor etch is recommended, as it generally eliminates any surface tension issues. This release step can be postponed, if it makes the further lithography problematic. Once the oxide is removed, the substrate can be etched further. Given that the top silicon is n-type and the bottom silicon is p-type, a selective etch can be used. This release step frees up the parts for alignment.

In a subsequent metallization step around the lens holder 940, the solder for locking the cantilever 910 and metallization for diebonding the gain diodes 920 and the PLC 930 is applied. Ideally a multi-layer coating like Ti/Pt/Au should be used. This is shown schematically in FIGS. 9a,b. If electrical heating is used to melt and lock the solder, then around the cantilever lockpoints, the metallization should be resistive so that the section can be electrically heated. This may require a prior thermal isolation layer of SiO2, and a resistive metallization of Ti/Cr and subsequent plating with solder, such as AuSn. This area is shown in the figure as 910. Alternatively, a laser soldering technique can be used to melt the solder and lock the arm in position. In this case, no built-in resistor would be needed.

Figure 9A:
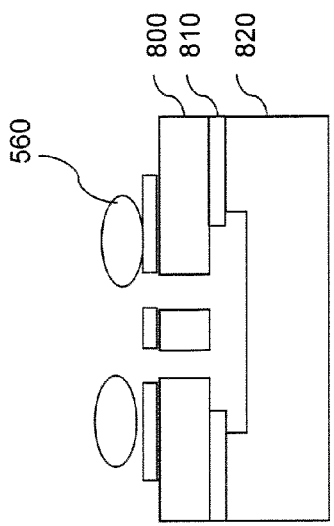
FIG. 9 shows further portions of a fabrication process in accordance with aspects of the invention, with FIGS. 9a,c showing cross-sectional views and FIGS. 9b,d showing respective top views; with FIGS. 9a,b showing a gold layer along with solder around the cantilever for locking and FIGS. 9c,d showing the PLC, lenses and semiconductor gain elements, with the cantilever moved to adjust the coupling and the solder melted to lock the cantilever in place.
Figure 9B:
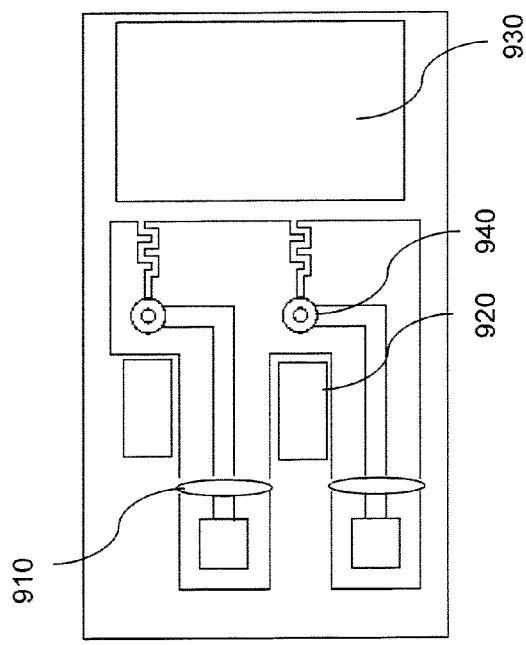
Figure 9C:
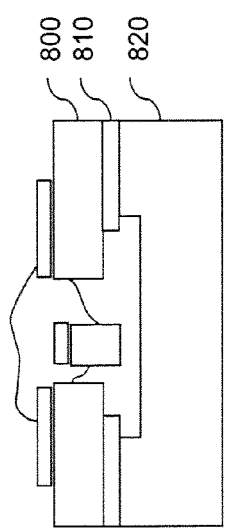
Figure 9D:
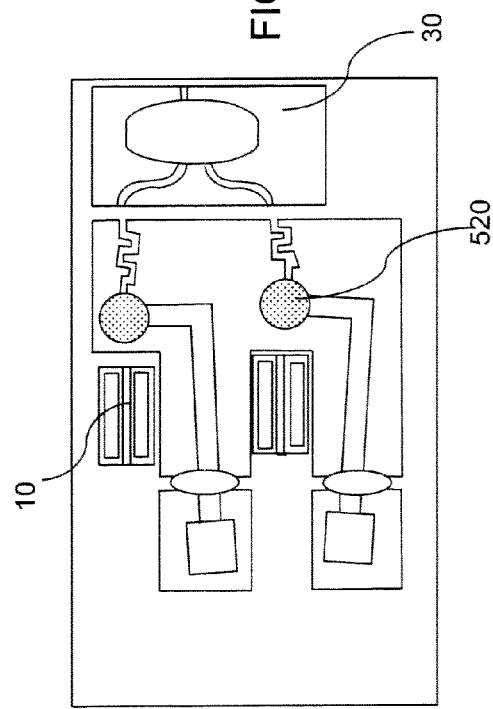

The breadboard is then populated with the gain diode, the lens and the PLC. All these parts are soldered on using electrical or laser soldering. FIG. 9c shows a cross section through the solder that is locking down the cantilever. In 9d, one can see that the springs are slightly deformed to optimize the coupling and that the lever is no longer in the central position, but locked at a point where the light is optimized.

The multiwavelength transmitter described is operated by activating a number of gain elements simultaneously. Compared to most lasers, the device has built in redundancy in that spare gain elements can be added to compensate either for poor manufacturing yield or for increased reliability. Catastrophic failure of one of the gain elements does not render the entire device inoperative, as other gain elements would still be emitting power. By decreasing the channel spacing and increasing the number of gain elements, an arbitrary amount of total power can be obtained in a fixed spectral width. The laser is compact and efficient.

FIG. 10 illustrates a further embodiment of a MEMS structure which may be used to mount a lens for coupling of light in accordance with aspects of the present invention. In the structure of FIG. 10, a lens on a lens holder 1080 may be moved using a handle 1010 about a stable anchor 1000. FIG. 10 is a top view of the structure with no forces or deflection. The structure is fabricated with a process similar to or the same as that described previously, or as in U.S. Provisional Patent Application No. 61/347,247, filed May 21, 2010, the disclosure of which is incorporated herein in its entirety, in that all the parts are released and are free to move with the exception of the anchor 1000. This part is connected to the rest of the wafer and therefore is stable. The structure generally has an L-shaped form, with the main lever 1060 connected to a horizontal lever 1050 by a flexure 1031, with the main lever and horizontal lever as illustrated orthogonal to one another. This horizontal lever is connected to the anchor with a relatively stiff flexure 1020 that can bend and twist. A lens is mounted on a lens mount 1080 between these two levers using a combination of flexures (1030, 1031, 1040a,b) and stiff cantilevers (1070a,b).

In summary, aspects of the invention may include a multi-wavelength source where multiple semiconductor gain elements are coupled to an external PLC and lase through the device. The PLC provides feedback to each gain element at a different wavelength and combines all the outputs together. By incorporating numerous gain elements very high total output powers can be obtained. It should be recognized, however, that the invention comprises the novel and non-obvious claims supported by this disclosure, and their insubstantial variations.

The invention claimed is:

1. A multi-wavelength light source, comprising:
   a plurality of laser diode gain elements, each having a front and a back, with the front providing an output, with the back coated with high reflectivity layers and the output antireflection coated, each gain element allowing for lasing at least any of a plurality of wavelengths;
   a planar lightwave circuit (PLC) including wavelength selective filters, the planar lightwave circuit configured to route light from a plurality of antireflection coated inputs of the PLC to a single output and to reflect, using a low reflectivity coating on the single output, at least some of the light from the single output back to the plurality of inputs on a wavelength selective basis using the wavelength selective filters, such that light of different wavelengths are routed to different inputs of the plurality of inputs; and
   a plurality of lenses, each configured to couple light between one of the laser diode gain elements and a corresponding input of the plurality of inputs of the PLC; and further comprising a plurality of moveable stages, with each of the plurality of lenses being mounted on a corresponding moveable stage repositionable during an alignment process; wherein each corresponding moveable stage comprises a lever.

2. The multi-wavelength light source of claim 1, wherein the PLC is arranged as an interferometric device.

3. The multi-wavelength light source of claim 2, wherein the interferometric device is one of an Echelle grating, a Mach-Zehnder interferometer or an arrayed waveguide grating (AWG).

4. The multi-wavelength light source of claim 1, wherein the lenses are mounted on the lever in a position so as to demagnify movement of the lenses with respect to movement of a portion the lever.

5. The multi-wavelength light source of claim 1, wherein the lever is a cantilever.

6. The multi-wavelength light source of claim 5, wherein each lens is mounted part way up each corresponding lever.

7. The multi-wavelength light source of claim 1, wherein each corresponding moveable stage comprises a plurality of levers.

8. The multi-wavelength light source of claim 7, wherein the plurality of levers include two levers orthogonal to one another.

9. A multi-wavelength light source, comprising:
   a plurality of laser diode gain elements;
   a planar lightwave circuit (PLC) having a wavelength selective arrayed waveguide grating (AWG) and a single output which is coated with a low reflectivity (LR) coating;
   a plurality of lenses, each of the lenses arranged to couple light between a one of the laser diode gain elements and the optical structure, each of the plurality of lenses being mounted on a structure including at least a lever;
   wherein each of the laser diode gain elements has a rear facet with a high reflective coating and a front facet with an anti-reflective coating.

10. The multi-wavelength light source of claim 9, wherein each of the laser diode gain elements has sufficient gain to lase at a plurality of wavelengths.

* * * * *